United States Patent [19]

Ito

[11] Patent Number: 4,695,781
[45] Date of Patent: Sep. 22, 1987

[54] DIGITAL TIME INTERVAL MEASURING APPARATUS

[75] Inventor: Kenji Ito, Fukaya, Japan

[73] Assignee: Kabushiki Kaisha Toshiba, Kawasaki, Japan

[21] Appl. No.: 911,382

[22] Filed: Sep. 25, 1986

[30] Foreign Application Priority Data

Sep. 30, 1985 [JP] Japan ................................ 60-216554

[51] Int. Cl.[4] ........................ G05B 19/21; G11B 21/02
[52] U.S. Cl. .................................... 318/603; 318/314; 360/52; 360/70
[58] Field of Search ......................... 318/66, 314, 603; 307/141; 324/78 D; 368/107, 110, 111, 112, 113, 118; 360/52, 70

[56] References Cited

U.S. PATENT DOCUMENTS

| 4,243,921 | 1/1981 | Tamura et al. ...................... 318/314 |
| 4,278,924 | 7/1981 | Mawatari et al. ................... 318/314 |
| 4,500,822 | 2/1985 | Tajima et al. ....................... 318/314 |
| 4,626,936 | 12/1986 | Yoshino .............................. 360/70 |
| 4,647,828 | 3/1987 | Wachi ................................. 318/603 |

Primary Examiner—William M. Shoop, Jr.
Assistant Examiner—Bentsu Ro
Attorney, Agent, or Firm—Cushman, Darby & Cushman

[57] ABSTRACT

A time interval measuring apparatus includes a single main counter, and a plurality of latch circuits each for latching the count content of the main counter every time a plurality of different pulses are supplied thereto. In this apparatus, one of the count contents, corresponding to two pulses to be measured, is substracted from the other thereof, thereby measuring the interval between the two pulses. This apparatus includes a circuit for stopping the count operation of the main counter before the count content of the main counter is latched, when a pulse is supplied, a circuit for storing the number of stop operations of the main counter performed within the time interval between the two pulses to be measured, and a circuit for correcting the time interval by a value corresponding to the count stop time, in accordance with the stored data representing the number of counter stop operations, when the time interval is obtained by subtracting the counter content from the latched content. Then, the operation margin of the main counter is increased, while the entire circuit scale is decreased.

23 Claims, 61 Drawing Figures

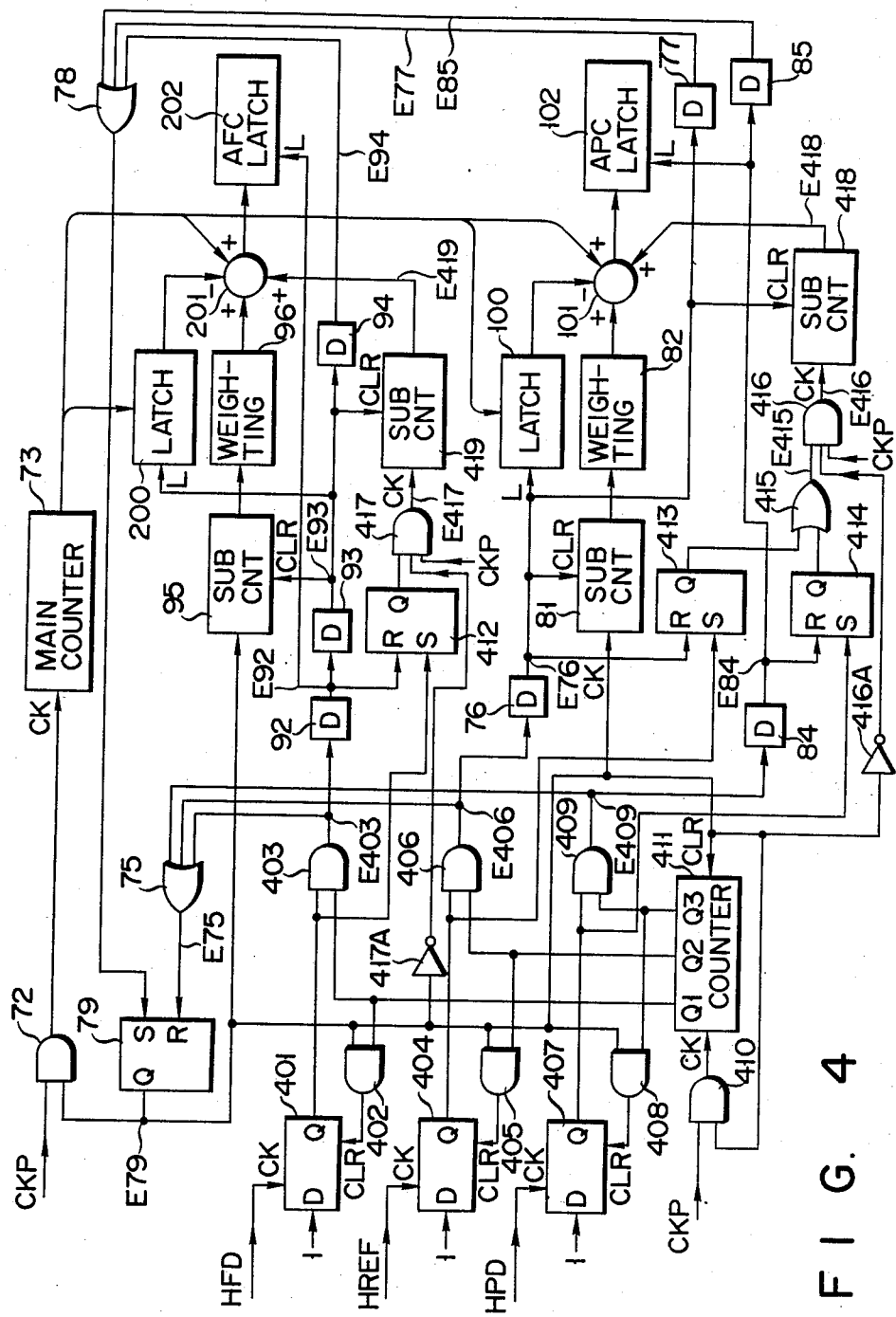
F I G. 4

DIGITAL TIME INTERVAL MEASURING APPARATUS

BACKGROUND OF THE INVENTION

The present invention relates to a digital time interval measuring apparatus which is suitable in a digital servo circuit and the like of a video tape recorder.

Units for digitally measuring the time intervals between any two of a plurality of pulses in a parallel manner are typically represented by a digital servo unit of a video tape recorder (VTR). FIG. 1 is a schematic block diagram of a VTR servo unit. In the VTR servo system, two motors, i.e., drum motor 11 for video heads and capstan motor 21 are controlled. Frequency generators 12 and 22 are mounted on the motor spindles of motors 11 and 21, respectively. The outputs from generators 12 and 22 are supplied to wave shapers 13 and 23, respectively. Outputs HFD from wave shapers 13 and 23 are supplied to AFC detectors 14 and 24. The output of detector 14 is fed back to adder 15, and the output of adder 15 is supplied, as a drive signal, to motor 11, via amplifier 16. The output of detector 24 is fed back to adder 25, and the output of adder 25 is supplied, as a drive signal, to motor 21, via amplifier 26. These two feedback loops constitute rotational frequency control systems of motors 11 and 21, respectively, so as to keep the rotational frequency or rotational speed of motors 11 and 21 constant.

The rotational phase control systems of motors 11 and 21 are arranged in the following manner.

On motor 11 side, a signal, representing the rotational phase of a video head, is detected by drum phase detector 17, and the detection signal is wave-shaped by shaper 18. Output HPD from shaper 18 is phase-compared with head reference signal HREF in APC detector 19. The phase difference component obtained by this phase-comparison is mixed with the output from detector 14 by adder 15. The mixed signal from adder 15 is supplied, as the drive signal, to motor 11, via amplifier 16. Then, the rotational phase of the video head is locked with signal HREF.

On motor 21 side, the output of generator 22 is wave-shaped by shaper 23. The obtained wave-shaped output (HFD) is frequency-divided by frequency divider 27. The frequency-divided output from divider 27 is fed back to APC detector 29 via contact R of switch 28 in the recording mode, and is phase-compared with capstan reference signal CREF. A phase difference component, obtained by the comparison, is input to adder 25. A sum of the phase difference component and the output of AFC detector 24 is supplied, as the drive signal, to motor 21, via amplifier 26. Then, the rotational phase of motor 21 is locked at signal CREF (corresponding to signal HREF).

When the VTR is in the recording mode, the output of generator 22 is utilized to control the rotational phase of motor 21. However, when the VTR is in the playback mode, switch 28 is changed to contact P side, and the output of control head 32, which is wave-shaped by shaper 33, is used for the phase control of the motor 21. Control head 32 reproduces a control pulse from tape 31 which is driven by capstan 30. Therefore, in the VTR playback mode, the tape travel position (the phase with respect to the position of the rotational head on the drum) is phase-locked with capstan reference signal CREF.

Now, a means for generating signals HREF and CREF will be described. A vertical sync signal, separated from a video signal, is supplied to input terminal 40.

In the VTR recording mode, the vertical sync signal, separated from the recording video signal, is supplied to reference generator 42 via switch 41. Generator 42 generates a signal synchronized with the vertical sync signal. The signal from generator 42 is frequency-divided by ½ frequency divider 43. The output from divider 43 is utilized as signals HREF and CREF.

In the VTR playback mode, switch 41 is turned off. Then, generator 42 free-runs to generate an oscillation signal having the same constant frequency as the vertical sync signal, which is independent of the sync signal from terminal 40. This oscillation signal is used as drum reference signal HREF and is supplied to tracking delay circuit 45 for tracking adjustment. The output of delay circuit 45 is obtained, via contact P of switch 44, as signal CREF. Delay circuit 45 is included to perform tracking adjustment when the mechanical, positional relationships among the video head, the capstan, and the control head are different in different VTRs.

As described above, in a VTR servo unit, system control is performed so that, in the recording mode, a recording pattern matching the standard of the video cassette recorder, such as the VHS system, is maintained and, in the playback mode, the recorded pattern is correctly traced by the video heads.

When a digital measurement means is to be adapted in the circuit system described above, digital measurement means must be provided at generator 42, frequency detector 14 and phase detector 19 of the drum side, and provided at frequency detector 24 and phase detector 29 of the capstan side, resulting in an increased circuit scale.

More specifically, since counters are required in the respective measurement means described above, at least 5 separate counters are required. In addition, each of four detectors 14, 19, 24, and 29 requires at least one latch circuit. In this manner, when a plurality of digital measurement units are merely provided to the respective portions of the circuitry, together with its peripheral circuits, the circuit scale is increased. In order to suppress the increase in circuit scale, a digital servo unit, which can decrease the required number of counters, is proposed.

In this digital servo unit, a cyclic counter serves as a timepiece. Therefore, when a latch pulse is supplied to the timepiece to latch the counter content, the count operation of the counter cannot be stopped. Accordingly, the operation speed of this counter must be set to allow latching of the time by the latch pulse, and to synchronize the count operation and the latch operation. This means that the operation speed of the counter has only a limited margin in consideration of the operation margin. In addition, when a sufficient margin is to be obtained, the number of circuit elements constituting the counter must be increased. Even with the above method, the number of latch circuits is large, and the merit (reduction in circuit scale) of mainly using counters is spoiled.

SUMMARY OF THE INVENTION

The present invention has been made in view of the above situation and has as its object to provide a digital time interval measuring apparatus in a system for parallel processing the time intervals among a plurality of pulses based on a single main counter, wherein the margin of the counter operation is increased, while the circuit scale can substantially be decreased.

The present invention provides an apparatus which comprises a single main counter (73), and a plurality of latch circuits (100, 200) each for latching the count content of the main counter (73) every time a plurality of different pulses (HREF, HPD, HFD) are supplied thereto. In this apparatus, one of the count contents, corresponding to two pulses to be measured, is subtracted from the other thereof, thereby measuring the interval between the two pulses. This apparatus includes: a circuit (72, 75-79, 84-85, 92-94) for stopping the count operation of the main counter (73) before the count content of the main counter is latched, when a pulse (HREF, HPD or HFD) is supplied; a circuit (81, 95) for storing the number of stop operations of the main counter performed within the time interval between the two pulses to be measured; and a circuit (82, 96) for correcting the time interval by a value corresponding to the count stop time, in accordance with the stored data representing the number of counter stop operations, when the time interval is obtained by subtracting the counter content from the latched content. Then, the operation margin of the main counter (73) is increased, while the entire circuit scale is decreased.

BRIEF DESCRIPTION OF THE DRAWINGS

FIG. 4 is a block diagram of another embodiment of the present invention;

DETAILED DESCRIPTION OF THE PREFERRED EMBODIMENTS

Figure 1:
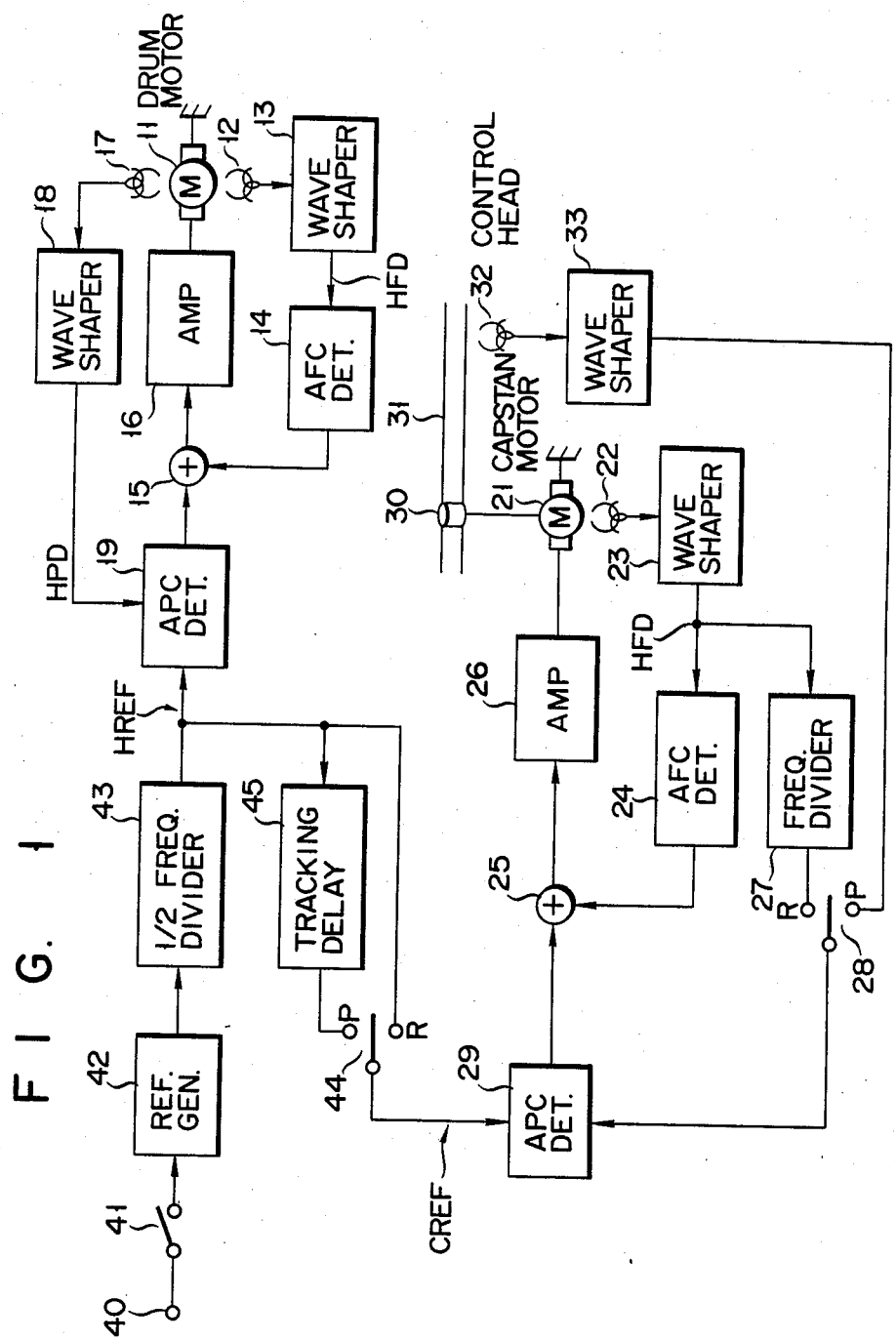
FIG. 1 is a schematic block diagram of a VTR servo system to which the present invention can be applied.
Figure 2:
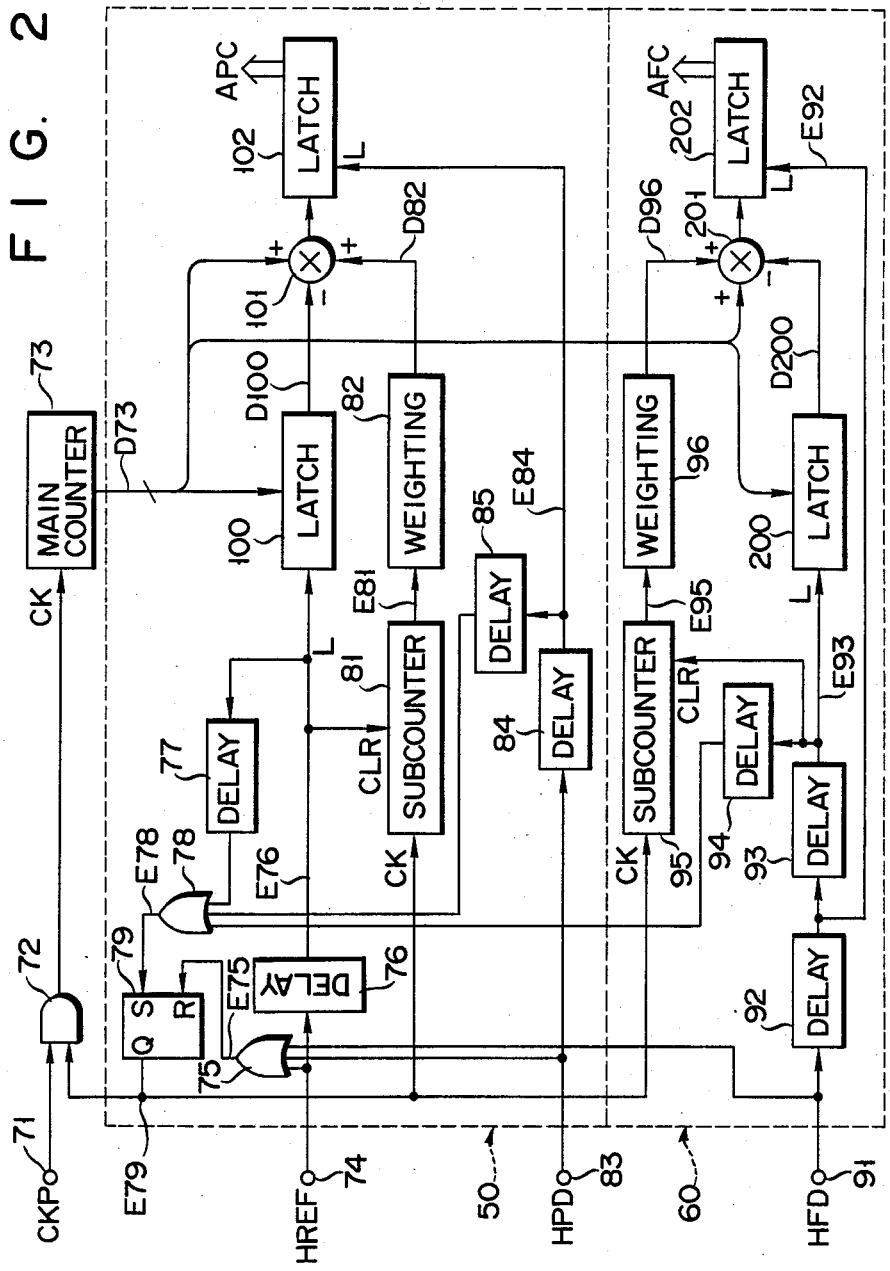
FIG. 2 is a block diagram of an embodiment of the present invention.

The embodiments of the present invention will be described with reference to the accompanying drawings. FIG. 2 shows an embodiment according to the present invention which is applied to a VTR servo system, and shows a servo circuit of drum motor 11. In automatic phase control (APC) system 50, drum reference signal HREF and drum phase signal HPD are used to control drum motor 11. In automatic frequency control (AFC) system 60, the time interval (period) of signal HFD is measured.

The circuit shown in FIG. 2 will be described in detail.

Main counter 73 counts the number of clocks CKP which are supplied from input terminal 71 via AND gate 72. When gate 72 is closed by gate pulse E79, clock CKP is prohibited from being supplied to counter 73.

Count content D73 of counter 73 is supplied to latch circuit 100 of APC system 50 and to the first input terminal of operational unit 101, and at the same time, to latch circuit 200 of AFC system 60 and the first input terminal of operational unit 201.

Signal HREF is supplied to OR gate 75 via input terminal 74, and also supplied, as latch pulse E76, to latch circuit 100 via delay circuit 76. Output E75 of gate 75 is supplied to the reset input terminal of RS-flip-flop (RS-FF) 79. When RS-FF 79 is reset, count stop signal (gate pulse) E79 is input to AND gate 72, and clock CKP is prohibited from being supplied to counter 73. However, signal HREF is supplied, as set pulse E78, to the set input terminal of RS-FF 79, via delay circuits 76 and 77 and OR gate 78. Accordingly, when signal HREF disappears, gate 72 is opened after elapsing the delay time of circuits 76 and 77, so that clock CKP is supplied again to counter 73.

In timing charts in FIGS. 3A to 3E, the above operation period corresponds to a period between times t1 to t2. In other words, latch circuit 100 latches the count (NR) which is obtained immediately after the temporary stop of counting of clocks CKP by counter 73 (at time t1).

Within an interval between times t1 and t2, subcounter 81 is cleared by output E76 from delay circuit 76. Content E81 of subcounter 81 is incremented every time Q output E79 of RS-FF 79 rises.

OR gate 75 also receives drum phase signal HPD supplied to input terminal 83, and drum frequency signal HFD supplied to input terminal 91.

Assume a case where signal HFD is input. Then, reset pulse E75 is output from gate 75 to reset RS-FF 79, so that the clock input to main counter 73 is stopped. However, signal HFD is also supplied to OR gate 78 via delay circuits 92, 93, and 94. As a result, when delay times, set by circuits 92 to 94, elapse, RS-FF 79 is set again, and the clock count by counter 73 is resumed. The timing of the above operation corresponds to the period between times t3 and t4 in FIGS. 3A to 3E.

Since RS-FF 79 once performs the operation of resetting and setting, subcounter 81 counts up at time t4.

Meanwhile, output E93 of delay circuit 93 is used as a latch pulse for latch circuit 200, and as a clear pulse for subcounter 95. Subcounter 95 also counts up when Q output E79 of RS-FF 79 rises. Content E95 of subcounter 95 is weighted by weighting circuit 96, and weighted value D96 thus obtained is supplied to operational unit 201. In unit 201, weighted value D96 is added to a value obtained by subtracting content D200 of latch circuit 200 from content D73 of main counter 73.

When signal HFD is input, latch pulse E92 is supplied from delay circuit 92 to latch circuit 202. Circuit 202 latches the output of operational unit 201 in response to pulse E92.

Figure 3:
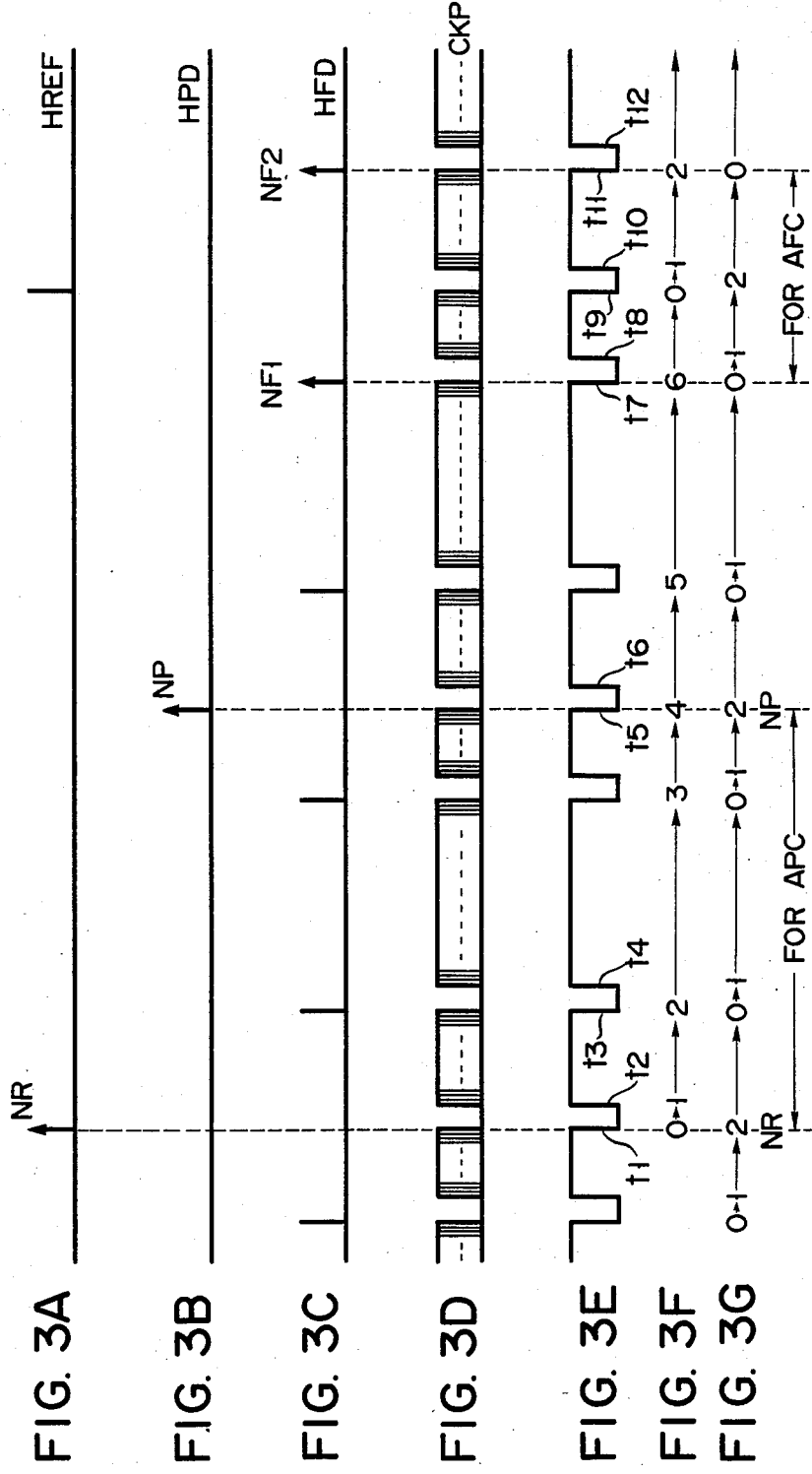
FIGS. 3A to 3G are timing charts explaining the operation of the embodiment shown in FIG. 2.

Assume that the latch and count operations are performed in the above manner, and that signal HPD is input to input terminal 83 at time t5 of FIG. 3B. Signal HPD is supplied to OR gate 75 and, at the same time, to OR gate 78 via delay circuits 84 and 85. On the other hand, when signal HPD is input, subcounter 81 counts up at time t6 after the delay time, set by delay circuits 84 and 85, elapses. Subcounter 95 also counts up at time t6.

When signal HPD is supplied, latch pulse E84 is supplied from delay circuit 84 to latch circuit 102. Circuit 102 latches the output from operational unit 101 by pulse E84. Unit 101 subtracts content D100 (NR in FIG. 3A) of latch circuit 100 from content D73 (NP in FIG. 3B) of main counter 73. Value D82 (D82=3*N1 in the example of FIGS. 3A to 3G), which is obtained by weighting output E81 from subcounter 81, is added, in unit 101, to the subtraction result. Weighting is performed by weighting circuit 82. The content, latched by latch circuit 102, indicates the time interval used for APC.

From time t1 to t4, FIGS. 3A to 3G show a sequence for storing APC data in latch circuit 102 once. In order to obtain the APC data, the time interval between signals HREF and HPD is measured. In the embodiment of FIG. 2, a plurality of stop periods exist, during which main counter 73 stops its counting (three stop periods exist between times t1 and t5 in FIGS. 3A to 3E). The number of this stop time is counted by subcounter 81.

If counter 73 continuously counts clocks CKP, the time interval can be obtained only by arithmetic operation of NP - NR. However, since count up of counter 73 is stopped three times as mentioned above, the number of clocks (CKP) during these stop periods must be compensated for. The number of clocks to be compensated can be easily calculated, since the stop period is preknown according to the delay time of each of delay circuits 76, 77, 84, 85, 92, 93, and 94. Output E81 of subcounter 81 is weighted in order to compensate for the clock number obtained by this calculation.

From time t7 to t11, FIGS. 3A to 3G show a sequence wherein latch circuit 202 of AFC system 60 obtains AFD data once.

Latch circuit 200 latches content D73 (at time t7) of counter 73 immediately after time t7. The count of counter 73 does not advance during a period between times t7 and t8. During a period between times t9 and t10, main counter 73 stops, since signal HREF exists. At time t11, the content of counter 73 is latched again by latch circuit 200. At this time, content D73 (NF2) of counter 73 and content D200 (NF1) of latch circuit 200, which has already been latched, are supplied to operational unit 201. In unit 201, arithmetic operation is performed using data content D200 (NF1) from latch circuit 200, content D73 (NF2) from counter 73, and content D96(2*N2) from weighting circuit 96. This content D96 is obtained by weighting count E95 of subcounter 95 by weighting circuit 96. In the example of the period between time t7 to t11 in FIGS. 3A to 3G, count E95 of subcounter 95 is 2. This represents that main counter 73 stops the clock counting during periods between times t7 and t8, and between times t9 and t10. Therefore, the number of clocks CKP, existing during these stop periods, is obtained from count 2 (stop times) of subcounter 95. Obtained value D96 (2*N2) is output from weighting circuit 96.

Operational unit 201 performs arithmetic operation of NF2−NF1+2*N2. This indicates the fact that the time interval (period) of signal HFD is measured using the number of clocks CKP. The measured value is latched by latch circuit 202 by pulse E92, during the period between times t11 and t12. The content, latched by circuit 202, represents the time interval used for AFC.

As described above, in the apparatus of the present invention, main counter 73 is stopped for a predetermined period of time by means of a sequence circuit which comprises the flip-flop, the delay circuits and so on. This main counter stop occurs every time a pulse, such as signal HREF, HPD or HFD, is supplied. As a result, data can be latched by latch circuits 100 and 200 with a certain time delay corresponding to the ripple delay time of main counter 73. From this, count and latch operations can be performed with a sufficient time margin. Therefore, an inexpensive non-sync cyclic counter can be used as the main counter, without a need for a comparatively expensive sync counter.

In addition, the number of the latch circuits can be reduced compared to a conventional case. In the present invention, delay circuits and subcounters are used instead of reducing the number of latch circuits. Since the delay circuits and the subcounters can have small number of bits, the circuit scale is greatly reduced. Once the characteristics (e.g., circuit constant, clock frequency, and so on) are determined, the number of clock pulses, generated between time interval of pulses to be measured, can be determined in advance. Therefore, a predetermined number of clock pulses can be used as correction data (weighting output).

Weighting circuits 82 and 96 need not be multipliers. For the sake of operation margin, however, it is preferable to use a multiplier as a weighting circuit.

Figure 12:
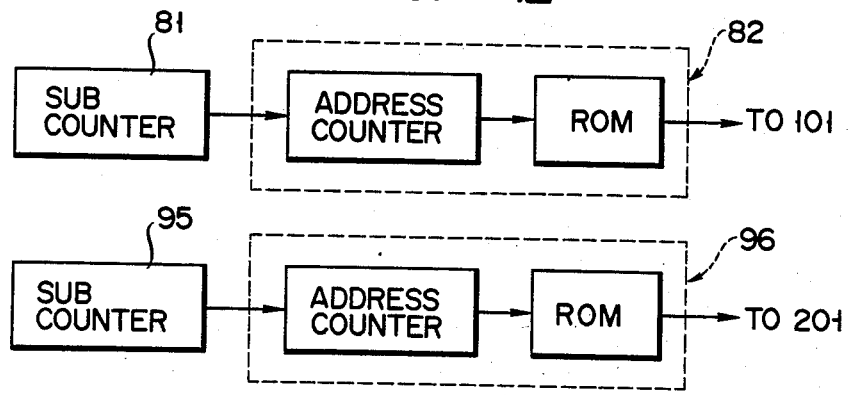
FIG. 12 is a block diagram showing details of weighting circuits 82 and 96 in FIG. 2.

Furthermore, as shown in FIG. 12, weighting circuit 82 or 96 can comprise an address counter for generating an address signal from the count output from subcounter 81 or 95, and a ROM, an address of which is designated by the output from the address counter.

In the above explanation, the servo circuit of the drum system was described. However, the present invention can be adapted to the APC or AFC system of the capstan system by utilizing the output of the same main counter 73.

As described above, the present invention can provide a digital time interval measuring apparatus wherein an operation margin of a counter is guaranteed while the circuit scale is reduced.

FIG. 4 shows another embodiment of the present invention. In the embodiment of FIG. 2, when signal HREF, HPD or HFD is generated during count stop period of main counter 73, an error can occur in weighted compensation value D82 or D9. This drawback is eliminated in the embodiment of FIG. 4. The same reference numerals in FIG. 4 denote the same parts as in FIG. 2, and a repetitive explanation therefor is thus omitted.

Referring to FIG. 4, drum frequency signal HFD is supplied as a clock signal to D-type flip-flop (D-FF) 401, D terminal level of which is 1. D-FF 401 is cleared by an output from AND gate 402 and supplies a Q output to the first input terminal of AND gate 403 when it is clocked by signal HFD. Similarly, drum reference signal HREF and drum phase signal HPD clock D-FFs 404 and 407, the D terminal levels of which are 1, respectively. D-FFs 404 and 407 are cleared by outputs from AND gate 405 and 408, respectively. When D-FF 404 is clocked by signal HREF, it supplies a Q output to the first input terminal of AND gate 406. When D-FF 407 is clocked by signal HPD, it supplies a Q output to the first input terminal of AND gate 409.

Q output E79 (a gate pulse for interrupting count of main counter 79) from RS-FF 79 is supplied to the first input terminals of AND gates 402, 405, and 408. The first bit Q1 output from 3-bit cyclic counter 411 is supplied to the second input terminals of AND gates 402 and 403. Similarly, the second bit Q2 output from counter 411 is supplied to the second input terminals of AND gates 405 and 406, and the third bit Q3 output from counter 411 is supplied to the second input terminals of AND gates 408 and 409. Counter 411 is clocked by clock CKP via AND gate 410. Q output E79 of RS-FF 79 opens/closes gate 410 and clears counter 411. Outputs E403, E406, and E409 from gates 403, 406, and 409 correspond to signals HFD, FREF, and FPD of FIG. 2, respectively, and are supplied to reset input terminal R of RS-FF 79 via OR gate 75.

The circuit components 401 to 411 of FIG. 4 are not provided in the embodiment of FIG. 2, and prevent RS-FF 79 from being simultaneously reset by two or three of signals HED, HREF, and HPD.

The Q output of RS-FF 401 is supplied to set input terminal S of RS-FF 412. Output E403 of AND gate 403 is delayed by delay circuit 92, and resultant delay output E92 from circuit 92 is supplied to reset input terminal R of RS-FF 412. The Q output of RS-FF 412 is supplied to the first input terminal of AND gate 417. The second input terminal of gate 417 receives, via inverter 417A, output E79. Clock CKP is supplied to the third input terminal of gate 417. Gate 417 supplies clock CKP to the clock input terminal of subcounter 419 only when RS-FF 412 is set while RS-FF 79 is reset. Then, subcounter 419 outputs value E419 representing a time period since RS-FF 79 is reset (i.e., AND gate 72 is closed and count of main counter 73 is interrupted) until latch circuit 202 performs latching in response to output E92. Value E419 is input to operational unit 201 as compensation data of the time interval data. Subcounter 419 is cleared, together with subcounter 95, by delay output E93 from delay circuit 93 after the latch by circuit 202 ends.

The Q output of RS-FF 404 is supplied to set input terminal S of RS-FF 413, and the Q output of RS-FF 407 is supplied to set input terminal S of RS-FF 414. RS-FF 413 is reset by delay output E76 from delay circuit 76, and RS-FF 414 is reset by delay output E84 from delay circuit 84. The Q outputs from RS-FFs 413 and 414 are supplied to the first input terminal of AND gate 416 via OR gate 415. The second input terminal of gate 416 receives, via inverter 416A, output E79. Clock CKP is input to the third input terminal of gate 416. Gate 416 supplies clock CKP to the clock input terminal of subcounter 418 only when RS-FF 413 or 414 is set while RS-FF 79 is reset. Then, subcounter 418 outputs value E418 representing a time period since count by counter 73 is interrupted until latch by latch circuit 100 or 102 is performed. Value E418 is input to operational unit 101 as compensation data for time interval data. Subcounter 418 is cleared, together with subcounter 81, by delay output E76 in synchronism with the latch by latch circuit 100 (i.e., after the latch by circuit 102 ends).

The above-mentioned circuit components 412 to 419 compensate the delay time of delay circuits 76, 84, and 92 by data E418 and E419. Therefore, the circuit shown in FIG. 4 can measure the time interval more precisely than the circuit of FIG. 2.

Figure 13:
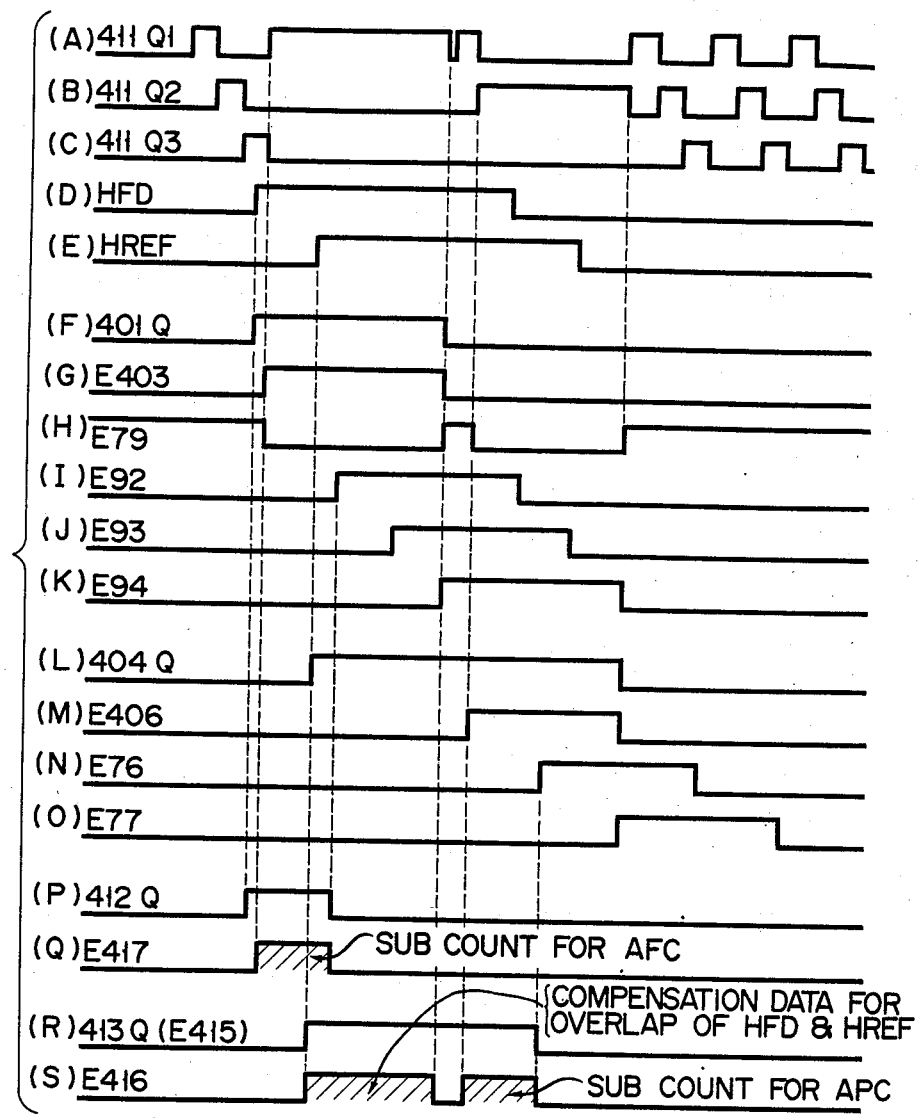
FIGS. 13A to 13S are timing charts explaining the operation of the embodiment shown in FIG. 4.

In the embodiment of FIG. 4, when signal HREF appears before signal HFD disappears as shown in FIG. 13 (D) and 13 (E), the signals in this embodiment may have timings shown in FIG. 13 (A)–13 (S). The Q output from RS - FF 412 (FIG. 13 (P)) indicates the period from the appearance of HFD to the start of data loading of latch 202. The Q output from RS-FF 413 (FIG. 13 (R)) indicates the period from the appearance of HREF to the start of data loading of latch 100. The Q output from RS-FF 414 indicates the period from the appearance of HPD to the start of data loading of latch 102. The period of the logical AND of the Q output from RS-FF 412 and the inverted level of E79 (output of 417A) is measured by subcounter 419. The contents of subcounter 419 indicates the number of the count-stop of main counter 73 caused by HFD. The period of the logical AND of the Q output from RS-FF 413 (or 414) and the inverted level of E79 (output of 416A) is measured by subcounter 418. The contents of subcounter 418 indicates the number of the count-stop of main counter 73 caused by HREF (or HPD). FIG. 13(S) teaches that an error due to the overlap of HFD and HREF can be compensated by a part of the contents of subcounter 418.

Figure 5:
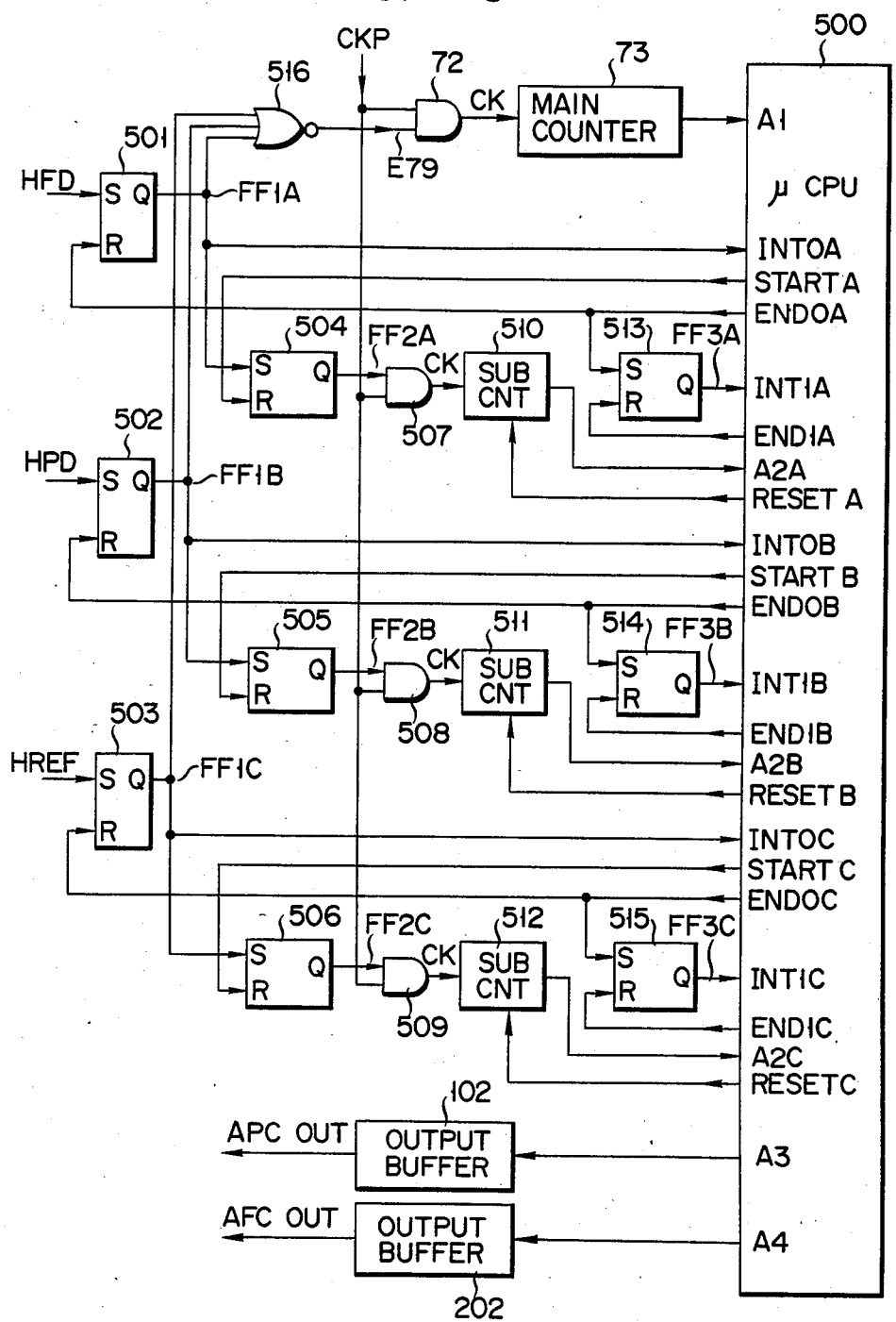
FIG. 5 is a block diagram of still another embodiment of the present invention.
Figure 6:
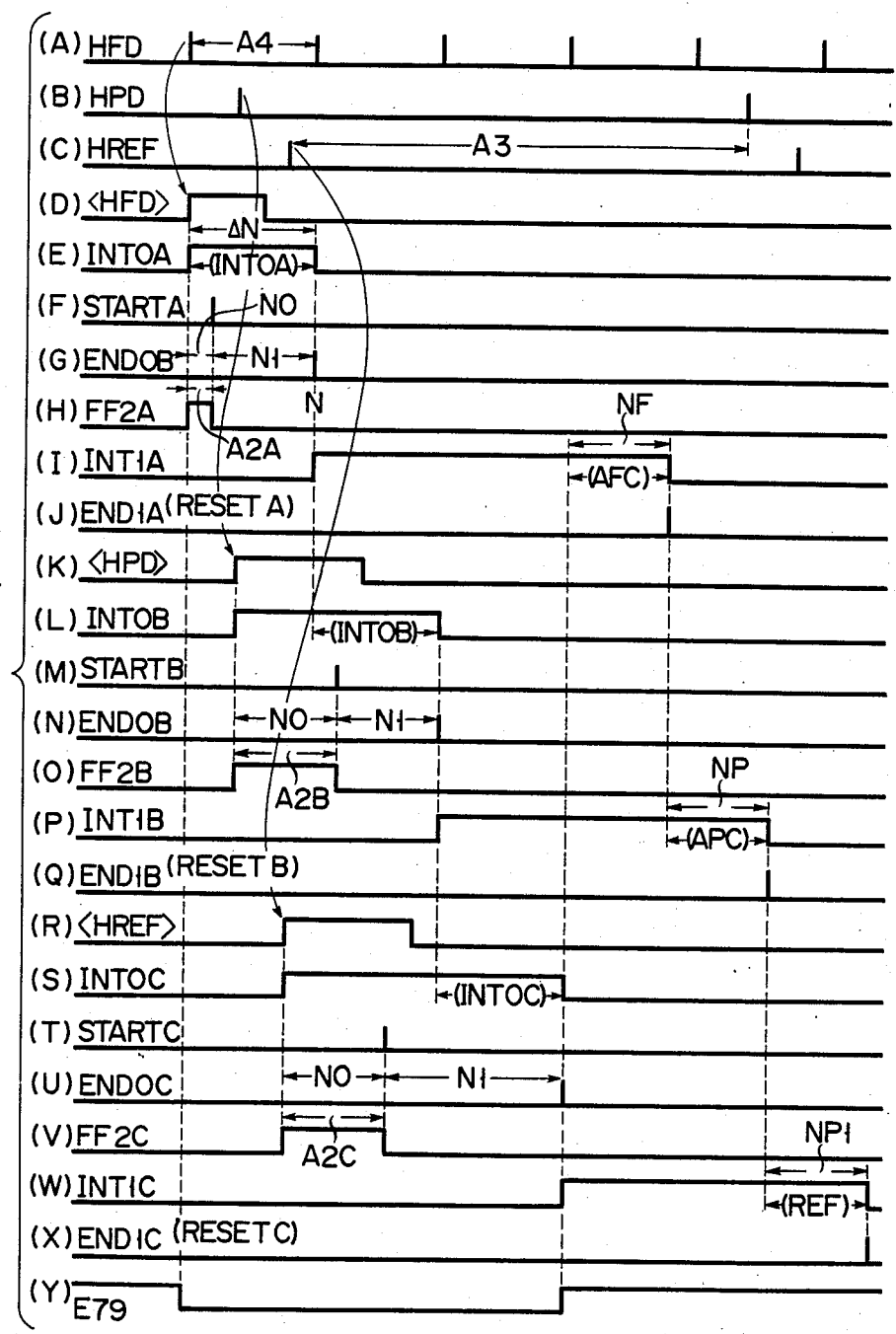
FIGS. 6A to 6Y are timing charts explaining the operation of the embodiment shown in FIG. 5.

FIG. 5 shows an embodiment wherein a microcomputer is used in the present invention. FIGS. 6A to 6Y are timing charts showing an example of an operating state of the embodiment shown in FIG. 5. FIGS. 6A to 6C have the same time scales, and FIGS. 6D to 6Y have the same scales expanded from those of FIGS. 6A to 6C. FIGS. 7 to 11 are flow charts showing an operation of software employed by microcomputer 500 shown in FIG. 5.

Referring to FIG. 5, drum frequency signal HFD (FIGS. 6A and 6D) is supplied to set input terminal S of RS-FF 501. Q output FF1A of RS-FF 501 is supplied to microcomputer 500 as interruption command INT0A (FIG. 6E). Command INT0A is supplied to AND gate 72 via NOR gate 516 in order to stop the count of main counter 73 while command INT0A is at high level. RS-FF 504 is set by rising of command INT0A. Q output FF2A (FIG. 6H) is supplied to the first input terminal of AND gate 507. Clock CKP is supplied to the second input terminal of gate 507. Gate 507 supplies clock CKP to subcounter 510 only while Q output FF2A is at high level. Subcounter 510 supplies count A2A (=N0) (FIG. 6H) corresponding to the high-level period of Q output FF2A to microcomputer 500.

Figure 7:
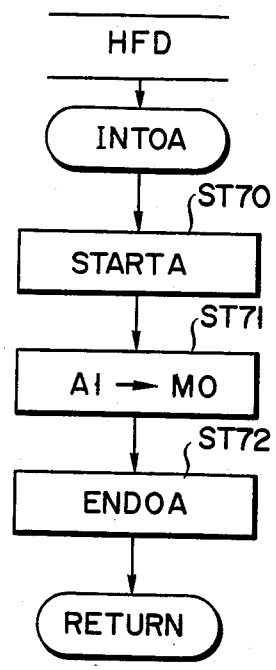
FIGS. 7 to 11 are flow charts indicating the steps executed by the CPU shown in FIG. 5.
Figure 8:
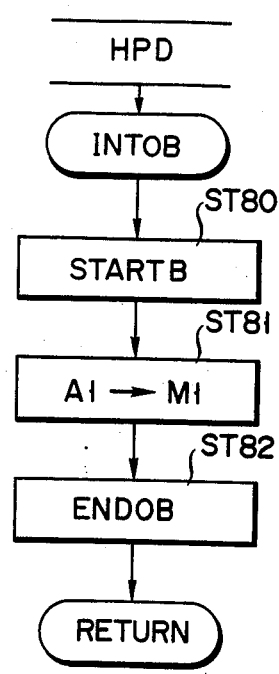
Figure 9:
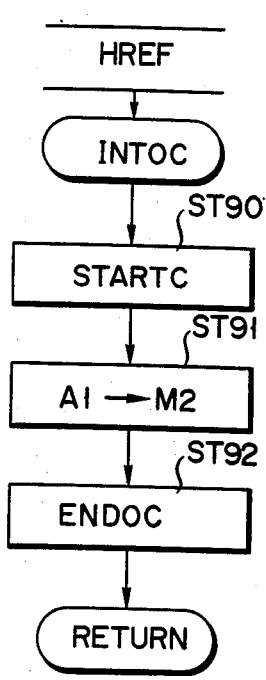

Upon reception of count A2A, microcomputer 500 supplies processing start signal STARTA (FIG. 6F) to reset input terminal R of RS-FF 504 in order to reset the same (ST70 of FIG. 7). This stops counting by subcounter 510. At the same time, count A1 of main counter 73 is stored at address M0 of a RAM (not shown) incorporated in microcomputer 500 (ST71 of FIG. 7). Thereafter, INT0A processing is performed corresponding to the count stop of main counter 73 during the high-level period of signal INT0A (FIG. 6E). More specifically, microcomputer 500 measures a period (N0) from generation of signal INT0A to generation of signal STARTA and a period (N1) from generation of STARTA to disabling of signal INT0A by counting clocks of a counter (not shown) incorporated therein, thereby calculating compensation data N (=N0+N1=ΔN) for the stop period of main counter 73 by INT0A processing. Note that ΔN corresponds to weighting of the embodiment of FIG. 2.

After data N is calculated, microcomputer 500 generates signal END0A (FIG. 6G) to reset RS-FF 501 and set RS-FF 513 (ST72 of FIG. 7). Then RS-FF 513 generates Q output FF3A and supplies interruption command INT1A (FIG. 6I) to microcomputer 500. When counting by main counter 73 is started again, microcomputer 500 performs AFC processing by signal INT1A based on drum frequency signal HFD. (The AFC processing period is indicated by NF in FIG. 6I). When interruption processing of signal INT1A including the AFC processing is ended, microcomputer 50 supplies processing end signal END1A to RS-FF 513 and reset signal RESETA to subcounter 510 (FIG. 6J).

In a similar manner, APC processing of interruption of signals INT0B and INT1B is performed for drum phase signal HPD by RS-FFs 502 and 505, AND gate 508, subcounter 511, and RS-FF 514. (This APC processing period is indicated by NP in FIG. 6P).

REF processing for determining APC reference by interruption of signals INT0C and INT1C is performed for drum reference signal HREF by RS-FFs 503 and 506, AND gate 507, subcounter 512, and RS-FF 515 (ST90 to ST92 of FIGS. 6R to 6X and 9). (This REF processing period is indicated by NP1 in FIG. 6W).

In FIG. 5, all of Q outputs FF1A to FF1C from RS-FFs 501 to 503 become gate pulse E79 (FIG. 6Y) via NOR gate 516 and controls opening/closing of AND gate 72. Therefore, AFC processing (FIG. 6I), APC processing (FIG. 6P), and REF processing (FIG. 6W) are not performed until all of INT0A processing (FIG. 6E), INT0B processing (FIG. 6L), and INT0C processing (FIG. 6S) are completed and all of RS-FFs 501 to 503 are reset.

The interruption priority to microcomputer 500 is in the order of INT0A > INT0B > INT0C > INT1A > INT1B > INT1C (in other words, interruptions INT0A to INT0C for fetching content A1 of main counter 73 have a priority over interruptions INT1A to INT1C for signal processing).

When APC and REF processing (FIGS. 6K to 6X) is completed in microcomputer 500, microcomputer 500 sends data A3, representing the phase difference (time interval) between signals HREF and HPD as shown in FIGS. 6B and 6C, to APC output buffer memory 102. When AFC processing (FIGS. 6D to 6X) is completed, microcomputer 500 sends data A4, representing the pulse interval (time interval) of signal HFD as shown in FIG. 6A, to AFC output buffer memory 202.

Figure 10:
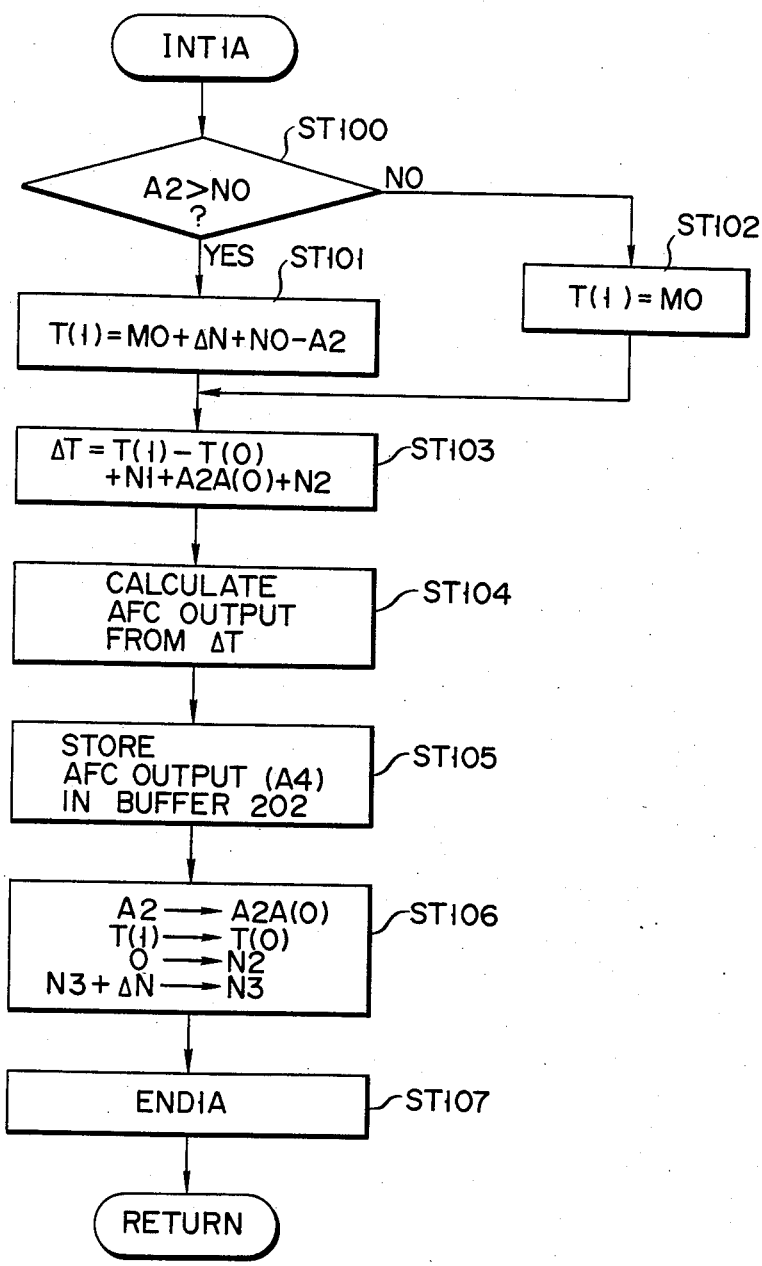

FIG. 10 shows a sequence of AFC processing which is performed by microcomputer 500 shown in FIG. 5 by INT1A interruption described above.

Assume that interruption INT1A is made at time $T=T(1)$. First, the count (A2) of subcounter 510 and data N0 are compared (ST100). If A2 > N0(YES), $M0+\Delta N+N0-A2(\Delta N=N0+N1)$ is used for data representing time T(1) (ST101). M0 indicates the content of address M0 at which count A1 of counter 73 is stored (cf. ST71 of FIG. 7). The term $\Delta N+N0-A2$ is caused by an overlap of AFC processing and other processing. If A2 ≦ N0 (NO), M0 is used for data representing time T(1) (ST102). After data, representing time T(1), is obtained in this manner, $\Delta T = T(1)-(0)+N1+A2A(0)+N2$ is calculated (ST103), where T(0) indicates time when A2=A2A(0) (FIG. 6H) is obtained. Here, N1+A2A(0) indicates an error caused by AFC processing, and N2 indicates another error caused by processing other than AFC. Then, time interval data for AFC is calculated from ΔT (ST104), and the calculated AFC data (A4) is stored in buffer 202(ST105). When the AFC data is obtained in this manner, content A2 of counter 510 at T=T(1) is stored at address A2A(0) of RAM (not shown) of microcomputer 500, T(1) is replaced with T(0), the value of the number of counter-stop times N2 of counter 73 is reset to 0, and a value, obtained by adding ΔN to the number of main counter interruption times N3, is used as new N3 (ST106).

When time interval data ΔT representing the pulse interval of HFD is obtained in this manner, processing end signal END1A is generated (ST107), and INT1A processing ends.

Figure 11:
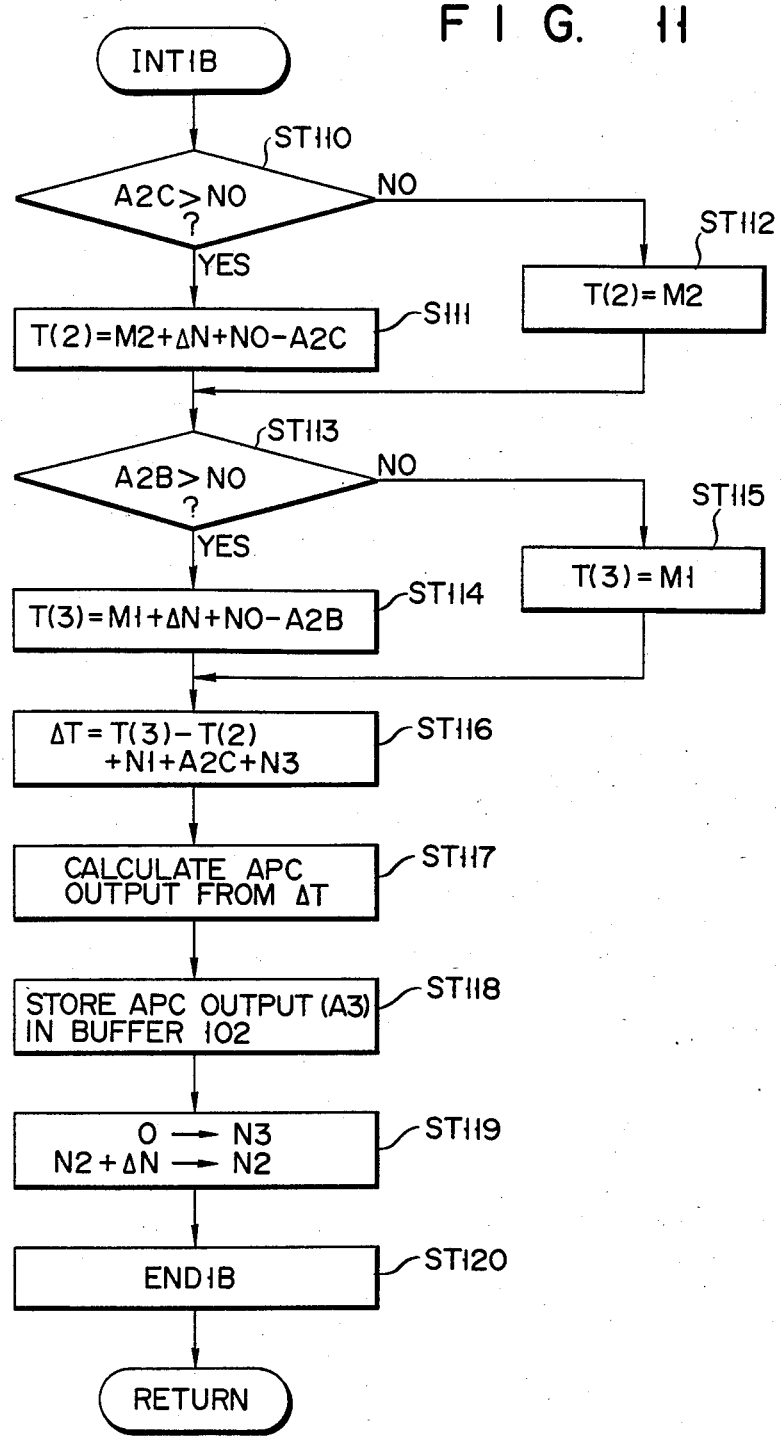

FIG. 11 shows a sequence of APC processing performed by microcomputer 500 by INT1B interruption.

First, count A2C (FIG. 6V) of subcounter 512 at $T=T(2)$ is compared with data N0 (ST110). If A2C > N0 (YES), $M2+\Delta N+N0-A2C$ is used for data representing time T(2) (ST111). M2 indicates the content of address M2 at which count A1 of counter 73 is stored (cf. ST91 of FIG. 9). If A2C ≦ N0 (NO), M2 is used for data representing time T(2) (ST112).

Next, count A2B (FIG. 6O) of subcounter 511 at $T=T(3)$ is compared with data N0 (ST113). If A2B > N0 (YES), $M1+\Delta N+N0-A2B$ is used for data representing time T(3) (ST114). M1 represents the content of address M1 at which count A1 of main counter 73 is stored (cf. ST81 of FIG. 8). N3 indicates the number of count-stop times of main counter 73. This count-stop is caused by processing other than APC. The value of N3 is obtained by counting the number of signals INT0B or INT0C supplied to microcomputer 500. If A2B ≦ N0 (NO in ST113), M1 is used for data representing time T(3) (ST115).

The interval (time interval) ΔT between HREF at $T=T(2)$ and HPD at $T=T(3)$ is calculated from difference $(T(3)-T(1))$ between T(3) (ST114 or 115) and T(2) (ST111 or ST112), which is obtained in the foregoing sequence, and from N1+A2C+N3 (ST116). Here, N1+A2C indicates an error caused by APC processing, and N3 indicates another error caused by processing other than APC. Then, time interval data for APC is calculated from ΔT (ST117), and the calculated APC data (A3) is stored in buffer 102 (ST118). When the APC data is obtained in this manner, N3 is set at 0, and N2 is updated to N2+ΔN (ST119). When the operation for obtaining time interval data ΔT, which representes the pulse interval between HREF and HPD, is completed, ing end signal END1B is generated (ST120), and INT1B processing ends.

As described above, even in the embodiment of FIG. 5 which utilizes a microcomputer, pulse intervals (time intervals) between a plurality of pulses (HFD, HPD, and HFD) can be processed in a parallel manner using single main counter 73. Since various data processing can be performed not during counting but during the period of count-interruption of main counter 73, circuit operation may have a certain margin. The error in a time interval measurement value (ΔT), caused by count interruption of counter 73, is removed by compensation operation (FIGS. 10 and 11) which is performed by a software in response to the count interruption.

What is claimed is:

1. A digital time interval measuring apparatus comprising:
   (a) main counter means, responsive to a predetermined clock signal and a gate signal, for stopping the counting of the clock signal when the gate signal is supplied, and for counting the clock signal when the gate signal is not supplied, thereby providing a main count value;
   (b) gate circuit means, responsive to predetermined timing signals, for supplying the gate signal to said main counter means when any one of the timing signals is generated;
   (c) count value storage means, coupled to said main counter means and said gate circuit means, for storing main count data representing the main count value obtained when said main counter means stops the counting of the clock signal in response to the gate signal;
   (d) compensation means, coupled to said gate circuit means, for providing compensation data corresponding to the number of the gate signals generated; and (e) time interval detection means for detecting time interval data, representing a signal time interval between one and another one of the predetermined timing signals, based on a difference between the main count value from said main counter means and the main count data from said count value storing means, and based on the compensation data from said compensation means.

2. An apparatus according to claim 1, wherein said compensation means includes:

subcounter means for counting the number of the gate signal generated, and providing a subcount value; and weighting means for performing predetermined weighting for the subcount value in order to change the subcount value to data corresponding to a period during which said main counter means stops the counting of the clock signal in response to generation of the gate signal, and generating the compensation data.

3. An apparatus according to claim 1, wherein said time interval detection means includes:

arithmetic means for adding the compensation data to data obtained by subtracting the main count data from the main count value, and providing an addition/subtraction result; and latch means for latching, after generation of the gate signal and immediately before disappearance of the gate signal, the addition/subtraction result to provide the time interval data.

4. An apparatus according to claim 2, wherein said time interval detection means includes:

arithmetic means for adding the compensation data to data obtained by subtracting the main count data from the main count value, and providing an addition/subtraction result; and latch means for latching, after generation of the gate signal and immediately before disappearance of the gate signal, the addition/subtraction result to provide the time interval data.

5. An apparatus according to claim 1, wherein the timing signals include a reference timing signal and a comparison timing signal, and wherein said gate circuit means includes means for outputting the gate signal after the reference timing signal is generated and before the comparison timing signal is generated.

6. An apparatus according to claim 2, wherein the timing signals include a reference timing signal and a comparison timing signal, and wherein said gate circuit means includes means for outputting the gate signal after the reference timing signal is generated and before the comparison timing signal is generated.

7. An apparatus according to claim 3, wherein the timing signals include a reference timing signal and a comparison timing signal, and wherein said gate circuit means includes means for outputting the gate signal after the reference timing signal is generated and before the comparison timing signal is generated.

8. An apparatus according to claim 1, wherein the timing signal includes timing pulses which are generated continuously, and wherein said gate circuit means includes means for providing the gate signal after one of the timing pulses is generated and before a next one thereof is generated.

9. An apparatus according to claim 2, wherein the timing signal includes timing pulses which are generated continuously, and wherein said gate circuit means includes means for providing the gate signal after one of the timing pulses is generated and before a next one thereof is generated.

10. An apparatus according to claim 3, wherein the timing signal includes timing signal pulses which are generated continuously, and wherein said gate circuit means includes means for providing the gate signal after one of the timing pulses is generated and before a next one thereof is generated.

11. An apparatus according to claim 1, wherein the timing signals include reference pulses, phase pulses, and frequency pulses, and wherein said gate circuit means includes;

means for generating the gate signal after the reference pulse is generated and before the phase pulse is generated, and generating the gate signal after one of the frequency pulses is generated and before a next one thereof is generated.

12. An apparatus according to claim 2, wherein the timing signals include reference pulses, phase pulses, and frequency pulses, and wherein said gate circuit means includes;

means for generating the gate signal after the reference pulse is generated and before the phase pulse is generated, and generating the gate signal after one of the frequency pulses is generated and before a next one thereof is generated.

13. An apparatus according to claim 3, wherein the timing signals include reference pulses, phase pulses, and frequency pulses, and wherein said gate circuit means includes;

means for generating the gate signal after the reference pulse is generated and before the phase pulse is generated, and generating the gate signal after one of the frequency pulses is generated and before a next one thereof is generated.

14. An apparatus according to claim 11, wherein said gate circuit means further includes:

means for generating the gate signal in response to only one of the reference pulses, the phase pulses, and the frequency pulses, even if two or more of these pulses are generated simultaneously, and, thereafter, for stopping the generation of the gate signal in response to only one generated pulse of the reference, phase and frequency pulses.

15. An apparatus according to claim 12, wherein said gate circuit means further includes:

means for generating the gate signal in response to only one of the reference pulses, the phase pulses, and the frequency pulses, even if two or more of these pulses are generated simultaneously, and, thereafter, for stopping the generation of the gate signal in response to only one generated pulse of the reference, phase and frequency pulses.

16. An apparatus according to claim 13, wherein said gate circuit means further includes:

means for generating the gate signal in response to only one of the reference pulses, the phase pulses, and the frequency pulses, even if two or more of these pulses are generated simultaneously, and, thereafter, for stopping the generation of the gate signal in response to only one generated pulse of the reference, phase and frequency pulses.

17. A digital time interval measuring apparatus comprising:
    (a) main counter means, responsive to a predetermined clock signal and a gate signal, for counting the clock signal when the gate signal does not exist, and outputting a main count value;
    (b) gate circuit means, responsive to predetermined timing signals, for supplying the gate signal to said main counter means when any one of the timing signals is generated; and
    (c) time interval calculation means for calculating time interval data representing a signal interval between one of the predetermined timing signals and another one thereof, based on the main count value obtained when said main counter means stops the counting of the clock signal in response to generation of the gate signal, and based on count stop data corresponding to a count stop period and the number of count stop operations of said main counter means.

18. A digital time interval measuring apparatus comprising:
    (a) cyclic counter means for counting a predetermined clock signal;
    (b) circuit means for generating a gate pulse to stop the counting of said cyclic counter means for a predetermined period of time, every time a predetermined timing pulse is supplied, and for stopping the generation of the gate pulse to allow said cyclic counter means to resume the counting when the predetermined period of time has elapsed;
    (c) first latch means for latching a content of said cyclic counter means in a stopped state, when a first pulse of two timing pulses among the predetermined timing pulses, a pulse interval of which is to be measured, is supplied;
    (d) means for counting the gate pulses which are generated upon reception of, among the two timing pulses, a second pulse following the first pulse, and weighting the obtained count to provide a correction value NX; and
    (e) second latch means, responsive to a content NA of said cyclic counter means, a content NB of said first latch means, and the correction value NX, for performing an arithmetic operation of NA−NB+NX, and latching the result of this arithmetic operation when the second pulse is supplied.

19. An apparatus according to claim 18, wherein, among the two timing pulses, the first pulse is a drum reference signal corresponding to a vertical sync signal generated from a reference generator of a video tape recorder; and the second pulse is a drum phase signal obtained by detecting rotation of a drum motor which rotates a video head.

20. An apparatus according to claim 18, wherein the two timing pulses are drum frequency signals continuously obtained from a rotation detecting circuit of a drum motor which rotates a video head of a video tape recorder.

21. An apparatus according to claim 18, wherein the two timing pulses are capstan motor frequency signals continuously obtained from a rotation detecting circuit for a capstan motor of a video tape recorder.

22. An apparatus according to claim 18, wherein, among the two timing pulses, the first pulse is a capstan reference signal obtained by frequency-dividing, into ½, a signal having the same frequency as that of a vertical sync signal generated by a reference generator of a video tape recorder; and the second pulse is a signal representing a rotational phase of a capstan which is sent from a rotation detecting circuit of a capstan motor for driving a video tape.

23. An apparatus according to claim 18, wherein, among the two timing pulses, the first pulse is a capstan reference signal obtained by frequency-dividing, into ½, a signal having the same frequency as a vertical sync signal generated by a reference generator of a video tape recorder; and the second pulse is an output from a control head which reproduces a control pulse recorded on a video tape.

* * * * *